US012575108B2

(12) United States Patent
Chung et al.

(10) Patent No.: US 12,575,108 B2
(45) Date of Patent: Mar. 10, 2026

(54) MEMORY DEVICE, INTEGRATED CIRCUIT, AND MANUFACTURING METHOD OF MEMORY DEVICE

(71) Applicant: Taiwan Semiconductor Manufacturing Company, Ltd., Hsinchu (TW)

(72) Inventors: Yun-Yan Chung, Hsinchu (TW); Chao-Ching Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 60 days.

(21) Appl. No.: 17/238,228

(22) Filed: Apr. 23, 2021

(65) Prior Publication Data

US 2022/0344357 A1 Oct. 27, 2022

(51) Int. Cl.
| | |
|---|---|
| *H10B 51/30* | (2023.01) |
| *H01L 21/02* | (2006.01) |
| *H10B 43/30* | (2023.01) |
| *H10D 30/67* | (2025.01) |
| *H10D 30/69* | (2025.01) |
| *H10D 48/36* | (2025.01) |
| *H10D 62/80* | (2025.01) |

(Continued)

(52) U.S. Cl.
CPC ....... *H10B 51/30* (2023.02); *H01L 21/02565* (2013.01); *H01L 21/02568* (2013.01); *H10B 43/30* (2023.02); *H10D 30/6739* (2025.01); *H10D 30/6757* (2025.01); *H10D 30/69* (2025.01); *H10D 30/701* (2025.01); *H10D 48/362* (2025.01); *H10D 62/80* (2025.01);

*H10D 64/685* (2025.01); *H10D 64/689* (2025.01); *H10D 64/693* (2025.01); *H10D 99/00* (2025.01)

(58) Field of Classification Search
CPC ............. H10D 30/031; H10D 30/0614; H10D 30/0616; H10D 30/6219
See application file for complete search history.

(56) References Cited

U.S. PATENT DOCUMENTS

| | | | | | |
|---|---|---|---|---|---|
| 5,612,238 | A | * | 3/1997 | Sato ........................ | G11C 14/00 |
| | | | | | 438/258 |
| 5,731,856 | A | * | 3/1998 | Kim ...................... | G02F 1/1345 |
| | | | | | 349/147 |

(Continued)

OTHER PUBLICATIONS

Lee, Hojin & Yoo, Geonwook & Yoo, Juhn-Seok & Kanicki, Jerzy. (2009). Asymmetric electrical properties of fork a-Si:H thin-film transistor and its application to flat panel displays. Journal of Applied Physics. 105. 124522-124522. 10.1063/1.3153968. (Year: 2009).*

(Continued)

*Primary Examiner* — Vincent Wall

(57) ABSTRACT

A memory device includes a transistor and a memory cell. The transistor includes a first gate electrode, a second gate electrode, a channel layer, and a gate dielectric layer. The second gate electrode is over the first gate electrode. The channel layer is located between the first gate electrode and the second gate electrode. The gate dielectric layer is located between the channel layer and the second gate electrode. The memory cell is sandwiched between the first gate electrode and the channel layer.

20 Claims, 15 Drawing Sheets

(51) Int. Cl.
    *H10D 64/68*        (2025.01)
    *H10D 99/00*        (2025.01)

(56) References Cited

U.S. PATENT DOCUMENTS

| | | | | |
|---|---|---|---|---|
| 5,744,823 | A * | 4/1998 | Harkin | H10D 86/60 257/350 |
| 5,744,864 | A * | 4/1998 | Cillessen | H01L 29/7869 257/749 |
| 5,768,184 | A * | 6/1998 | Hayashi | G11C 11/5642 365/185.2 |
| 6,563,174 | B2 * | 5/2003 | Kawasaki | H01L 29/66969 257/E29.151 |
| 7,211,825 | B2 * | 5/2007 | Shih | H01L 29/7869 257/66 |
| 8,513,661 | B2 * | 8/2013 | Takahashi | H10D 30/6734 257/E29.296 |
| 9,029,851 | B2 * | 5/2015 | Miyairi | H10D 86/471 257/43 |
| 10,192,995 | B2 * | 1/2019 | Tezuka | H01L 27/1225 |
| 2005/0017302 | A1 * | 1/2005 | Hoffman | H01L 29/78696 438/149 |
| 2005/0199959 | A1 * | 9/2005 | Chiang | H01L 29/7869 257/368 |
| 2009/0169919 | A1 * | 7/2009 | Garcia | C23C 14/5806 428/688 |
| 2015/0011048 | A1 * | 1/2015 | Tanaka | H01L 29/4234 438/104 |
| 2015/0349130 | A1 * | 12/2015 | Tanemura | H01L 29/792 257/43 |
| 2017/0038623 | A1 * | 2/2017 | Lee | H10D 86/421 |
| 2018/0108870 | A1 * | 4/2018 | Lee | H10K 59/8791 |
| 2018/0233597 | A1 * | 8/2018 | Yamamoto | H01L 29/78696 |
| 2020/0091274 | A1 * | 3/2020 | Sharma | H10D 64/689 |
| 2020/0411078 | A1 * | 12/2020 | Sharma | H10B 12/315 |
| 2021/0028292 | A1 * | 1/2021 | Wu | H01L 21/02532 |

OTHER PUBLICATIONS

Lausecker, Elisabeth & Huang, Y. & Fromherz, T. & Sturm, J. & Wagner, S . . . (2010). Self-aligned imprint lithography for top-gate amorphous silicon thin-film transistor fabrication. Applied Physics Letters. 96. 263501-263501. 10.1063/1.3457446. (Year: 2010).*

* cited by examiner

MEMORY DEVICE, INTEGRATED CIRCUIT, AND MANUFACTURING METHOD OF MEMORY DEVICE

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
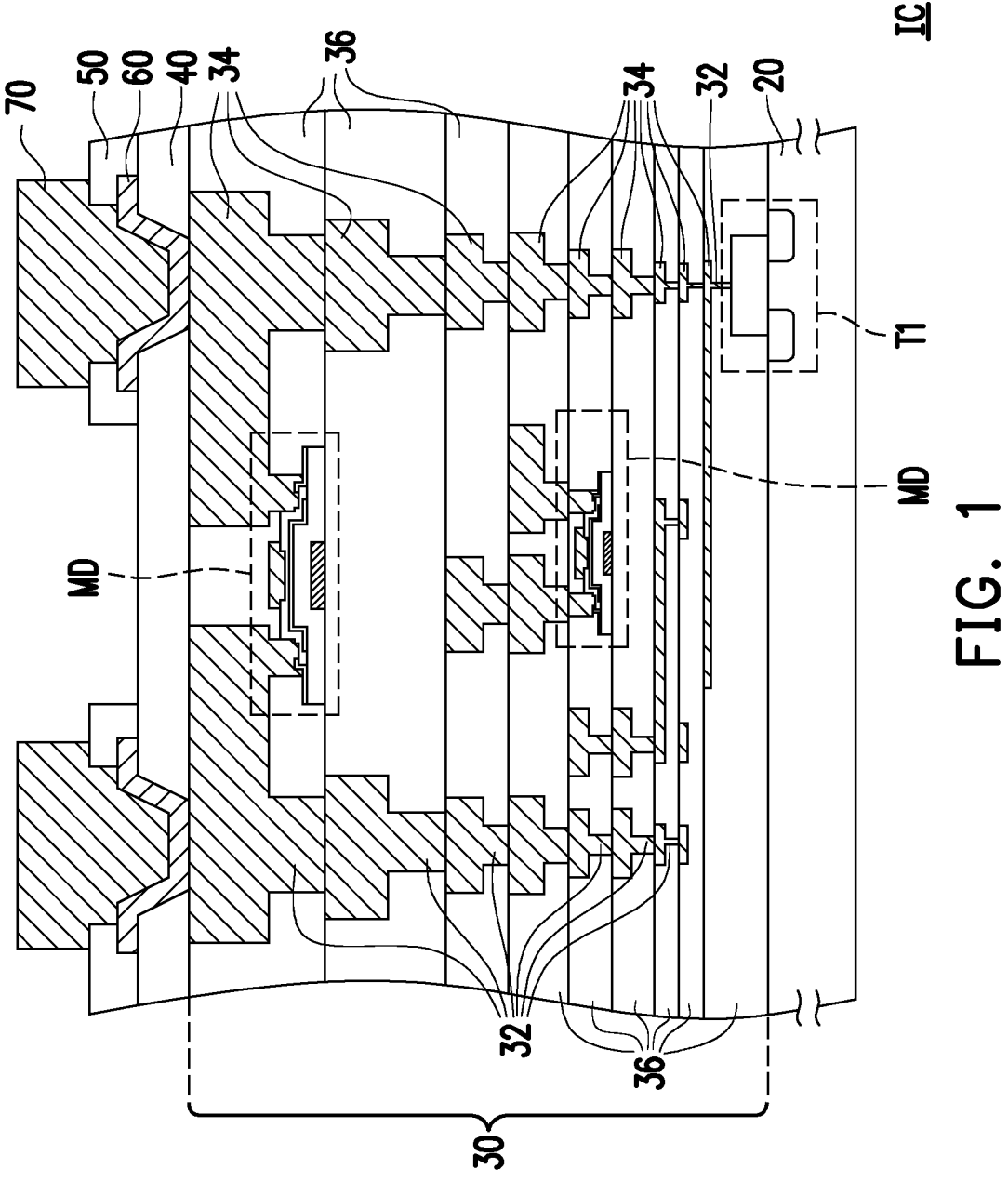
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. In some embodiments, the integrated circuit IC includes a substrate 20, an interconnect structure 30, a passivation layer 40, a post-passivation layer 50, a plurality of conductive pads 60, and a plurality of conductive terminals 70. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a first transistor T1, which is over the substrate 20. Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. On the other hand, the metal gate is located above the substrate 20 and is embedded in the interconnect structure 30. In some embodiments, the first transistor T1 is formed using suitable Front-end-of-line (FEOL) process. For simplicity, one first transistor T1 is shown in FIG. 1. However, it should be understood that more than one first transistors T1 may be presented depending on the application of the integrated circuit IC. When multiple first transistors T1 are presented, these first transistors T1 may be separated by shallow trench isolation (STI; not shown) located between two adjacent first transistors T1.

As illustrated in FIG. 1, the interconnect structure 30 is disposed on the substrate 20. In some embodiments, the interconnect structure 30 includes a plurality of conductive vias 32, a plurality of conductive patterns 34, a plurality of dielectric layers 36, and a plurality of memory devices MD. As illustrated in FIG. 1, the conductive patterns 34 and the conductive vias 32 are embedded in the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1. For example, the bottommost conductive vias 32 are connected to the metal gate, which is embedded in the bottommost dielectric layer 36, of the first transistor T1. In other words, the bottommost conductive vias 32 establish electrical connection between the first transistor T1 and the conductive patterns 34 of the interconnect structure 30. As illustrated in FIG. 1, the bottommost conductive via 32 is connected to the metal gate of the first transistor T1. It should be noted that in some alternative cross-sectional views, other bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, or the like. The dielectric layers 36 may be formed by suitable fabrication techniques such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

In some embodiments, the memory devices MD are also embedded in the interconnect structure 30. For example, each memory device MD is embedded in one of the dielectric layers 36. The formation method and the structure of the memory devices MD will be described in detail later. Depending on the types of the memory cells in the memory devices MD, the memory devices MD may be Silicon-Oxide-Nitride-Oxide-Silicon (SONOS) devices, Ferroelectric Random Access Memory (FeRAM) devices, Resistive Random Access Memory (RRAM) devices, Dynamic Random Access Memory (DRAM) device, Static Random Access Memory (SRAM) device, Magnetoresistive Random Access Memory (MRAM), or the like.

As illustrated in FIG. 1, the passivation layer 40, conductive pads 60, the post-passivation layer 50, and the conductive terminals 70 are sequentially formed on the interconnect structure 30. In some embodiments, the passivation layer 40 is disposed on the topmost dielectric layer 36 and the topmost conductive patterns 34. In some embodiments, the passivation layer 40 has a plurality of openings partially exposing each topmost conductive pattern 34. In some embodiments, the passivation layer 40 is a silicon oxide layer, a silicon nitride layer, a silicon oxy-nitride layer, or a dielectric layer formed by other suitable dielectric materials. The passivation layer 40 may be formed by suitable fabrication techniques such as HDP-CVD, PECVD, or the like.

In some embodiments, the conductive pads 60 are formed over the passivation layer 40. In some embodiments, the conductive pads 60 extend into the openings of the passivation layer 40 to be in direct contact with the topmost conductive patterns 34. That is, the conductive pads 60 are electrically connected to the interconnect structure 30. In some embodiments, the conductive pads 60 include aluminum pads, copper pads, titanium pads, nickel pads, tungsten pads, or other suitable metal pads. The conductive pads 60 may be formed by, for example, electroplating, deposition, and/or photolithography and etching. It should be noted that the number and the shape of the conductive pads 60 illustrated in FIG. 1 are merely for illustrative purposes, and the disclosure is not limited thereto. In some alternative embodiments, the number and the shape of the conductive pad 60 may be adjusted based on demand.

In some embodiments, the post-passivation layer 50 is formed over the passivation layer 40 and the conductive pads 60. In some embodiments, the post-passivation layer 50 is formed on the conductive pads 60 to protect the conductive pads 60. In some embodiments, the post-passivation layer 50 has a plurality of contact openings partially exposing each conductive pad 60. The post-passivation layer 50 may be a polyimide layer, a PBO layer, or a dielectric layer formed by other suitable polymers. In some embodiments, the post-passivation layer 50 is formed by suitable fabrication techniques such as HDP-CVD, PECVD, or the like.

As illustrated in FIG. 1, the conductive terminals 70 are formed over the post-passivation layer 50 and the conductive pads 60. In some embodiments, the conductive terminals 70 extend into the contact openings of the post-passivation layer 50 to be in direct contact with the corresponding conductive pad 60. That is, the conductive terminals 70 are electrically connected to the interconnect structure 30 through the conductive pads 60. In some embodiments, the conductive terminals 70 are conductive pillars, conductive posts, conductive balls, conductive bumps, or the like. In some embodiments, a material of the conductive terminals 70 includes a variety of metals, metal alloys, or metals and mixture of other materials. For example, the conductive terminals 70 may be made of aluminum, titanium, copper, nickel, tungsten, tin, and/or alloys thereof. The conductive terminals 70 are formed by, for example, deposition, electroplating, screen printing, or other suitable methods. In some embodiments, the conductive terminals 70 are used to establish electrical connection with other components (not shown) subsequently formed or provided.

As mentioned above, the memory devices MD are embedded in the interconnect structure 30. Taking the topmost memory device MD shown in FIG. 1 as an example, the formation method and the structure of this memory device MD will be described below in conjunction with FIG. 2A to FIG. 2H and FIG. 3A to FIG. 3H.

FIG. 2A to FIG. 2H are schematic perspective views illustrating various stages of a manufacturing method of the memory device MD in FIG. 1. FIG. 3A to FIG. 3H are cross-sectional views illustrating various stages of the manufacturing method of the memory device MD in FIG. 2A to FIG. 2H. It should be noted that the cross-sectional views of FIG. 3A to FIG. 3H are taken along cross-sectional line A-A' in FIG. 2A to FIG. 2H.

Figure 2A:
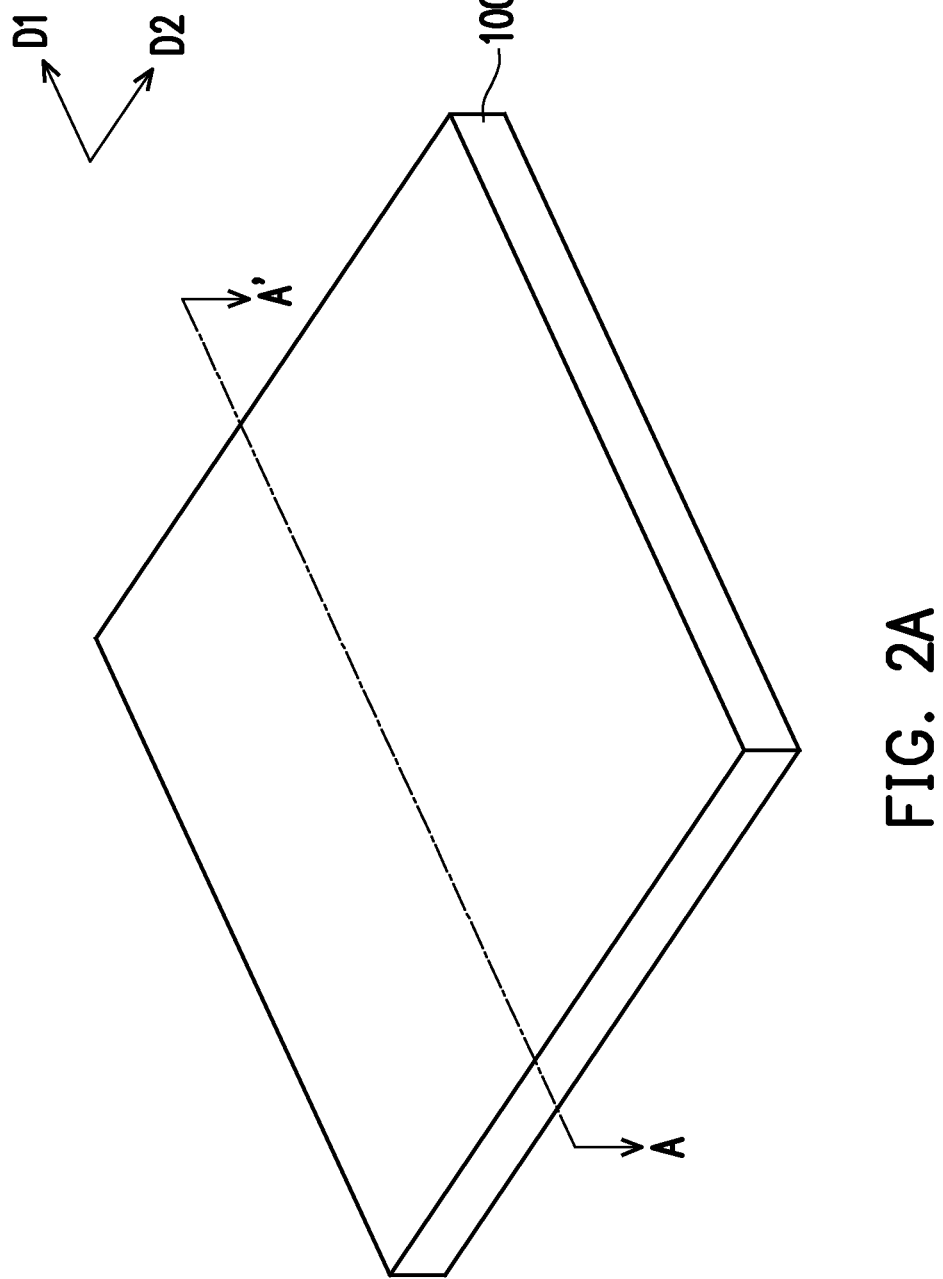
FIG. 2A to FIG. 2H are schematic perspective views illustrating various stages of a manufacturing method of the memory device in FIG. 1.
Figures 3A, 3B:
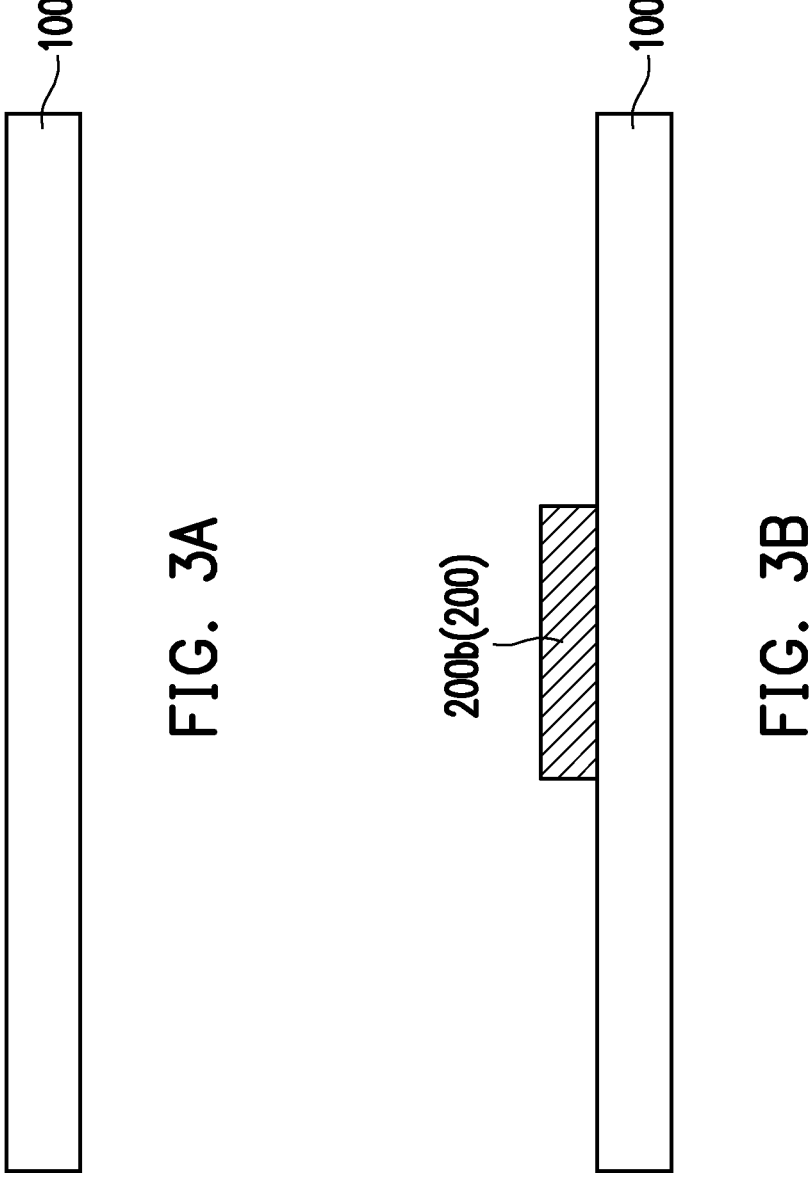
FIG. 3A to FIG. 3H are cross-sectional views illustrating various stages of the manufacturing method of the memory device in FIG. 2A to FIG. 2H.

Referring to FIG. 2A and FIG. 3A, a dielectric layer 100 is provided. In some embodiments, the dielectric layer 100 is one of the dielectric layers 36 of the interconnect structure 30 of FIG. 1, so the detailed description thereof is omitted herein.

Figure 2B:
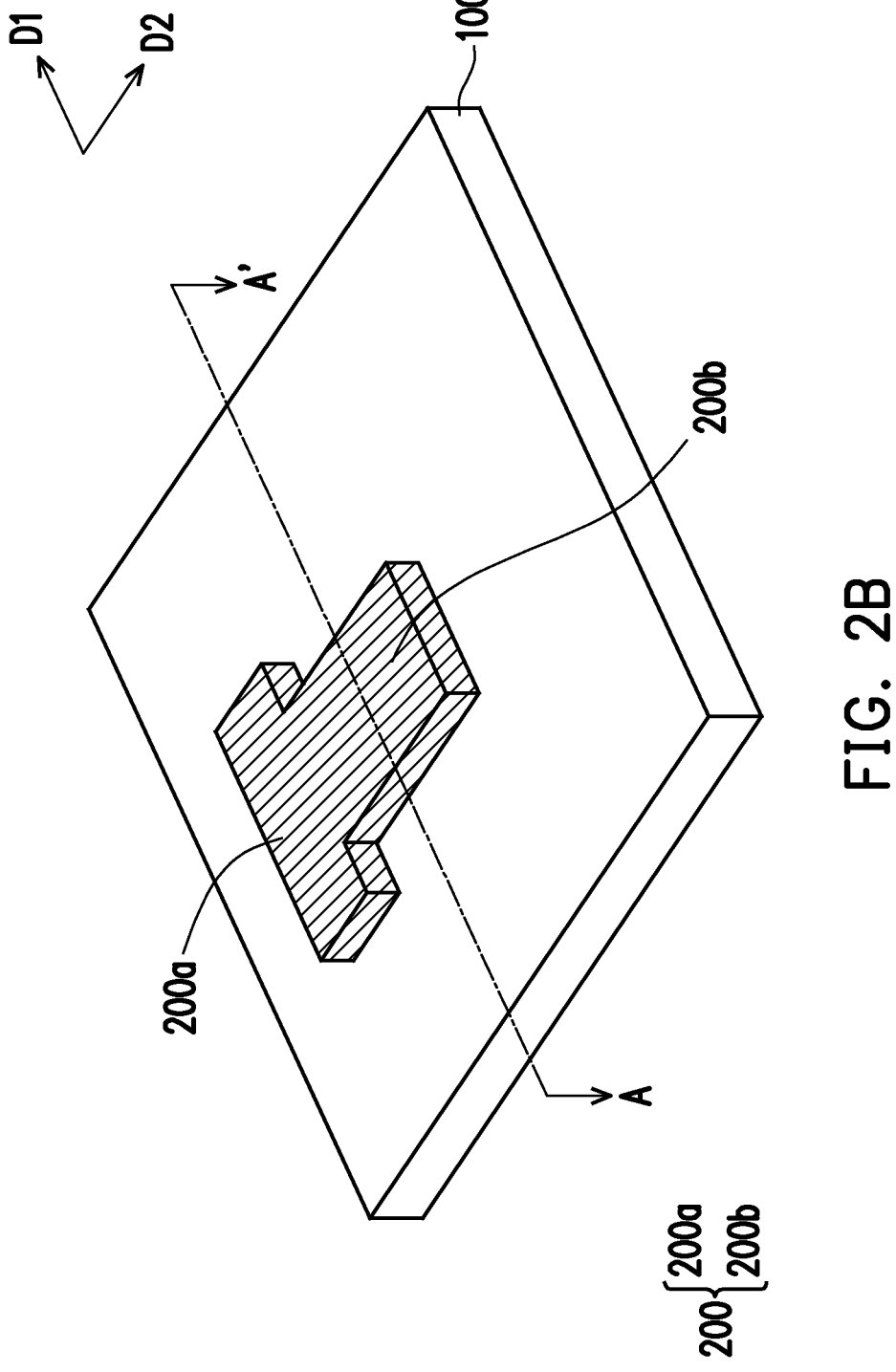

Referring to FIG. 2B and FIG. 3B, a first gate electrode 200 is formed on the dielectric layer 100. In some embodiments, the first gate electrode 200 is formed by a photolithography and etching process. For example, a metallic material (not shown) is conformally formed on the dielectric layer 100. In some embodiments, the metallic material is deposited through atomic layer deposition (ALD), CVD, physical vapor deposition (PVD), or the like. Thereafter, a patterned photoresist layer (not shown) is formed on the metallic material to define the shape of the subsequently formed first gate electrode 200. Subsequently, an etching process is performed to remove the metallic material that is not covered by the patterned photoresist layer. The etching process includes, for example, an anisotropic etching process such as dry etch or an isotropic etching process such as wet etch. Then, the patterned photoresist layer is removed through a stripping process or the like to expose the remaining metallic material, which constitutes the first gate electrode 200.

In some embodiments, the metallic material of the first gate electrode 200 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the first gate electrode 200 also includes materials to fine-tune the corresponding work function. For example, the metallic material of the first gate electrode 200 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

In some embodiments, a barrier layer (not shown) is optionally formed between the first gate electrode 200 and the dielectric layer 100, so as to avoid diffusion of atoms between elements. In some embodiments, a material of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

In some embodiments, a thickness of the first gate electrode 200 ranges from about 30 Å to about 250 Å. In some embodiments, the first gate electrode 200 has a first portion 200a and a second portion 200b connected to the first portion 200a. As illustrated in FIG. 2B, the first portion 200a of the first gate electrode 200 extends along a first direction D1. Meanwhile, the second portion 200b of the first gate electrode 200 extends along a second direction D2 perpendicular to the first direction D1. In other words, the first portion 200a of the first gate electrode 200 is perpendicular to the second portion 200b of the first gate electrode 200. For example, as illustrated in FIG. 2B, the first gate electrode 200 exhibits a T shape from the top view.

Figure 2C:
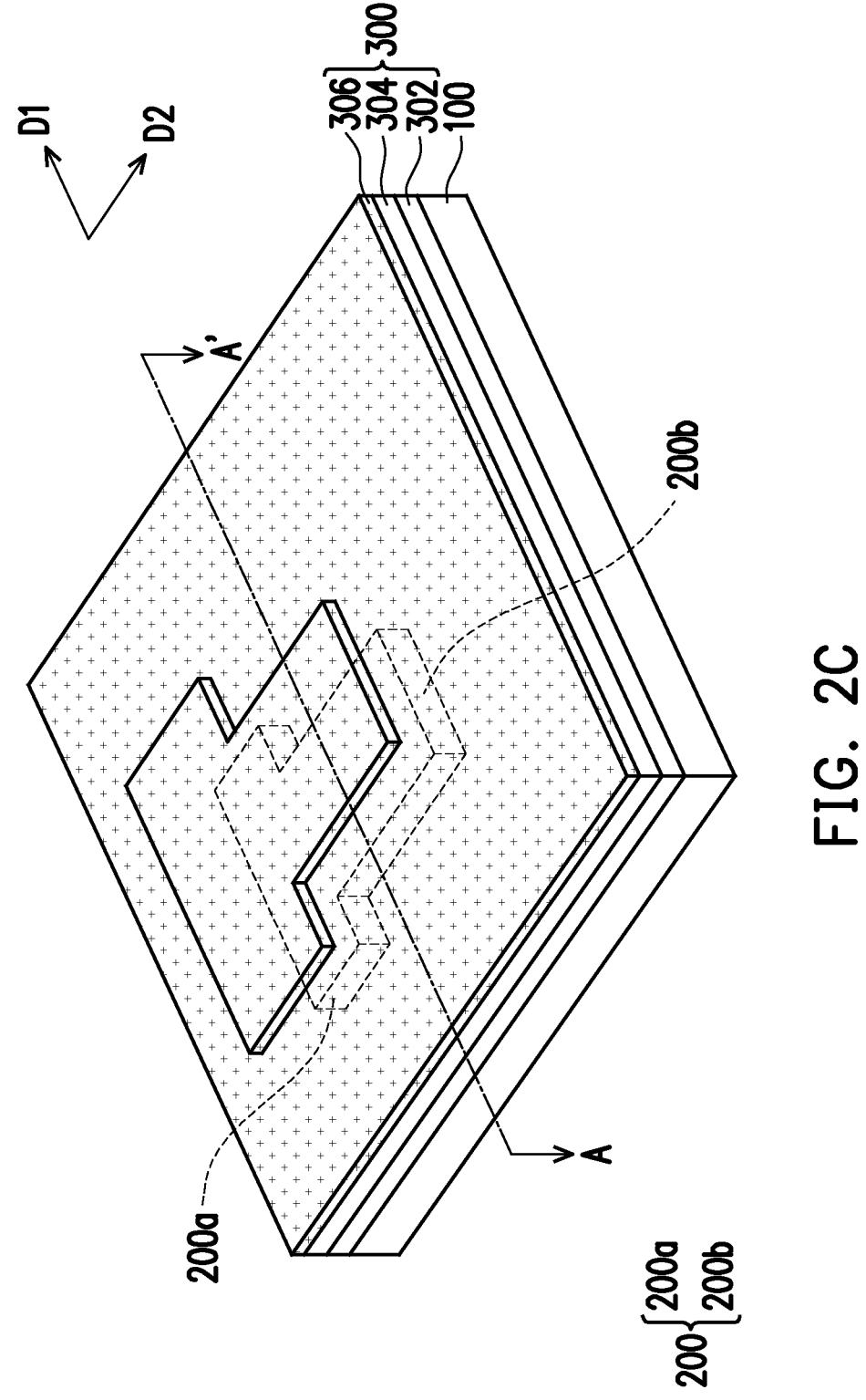
Figures 3C, 3D:
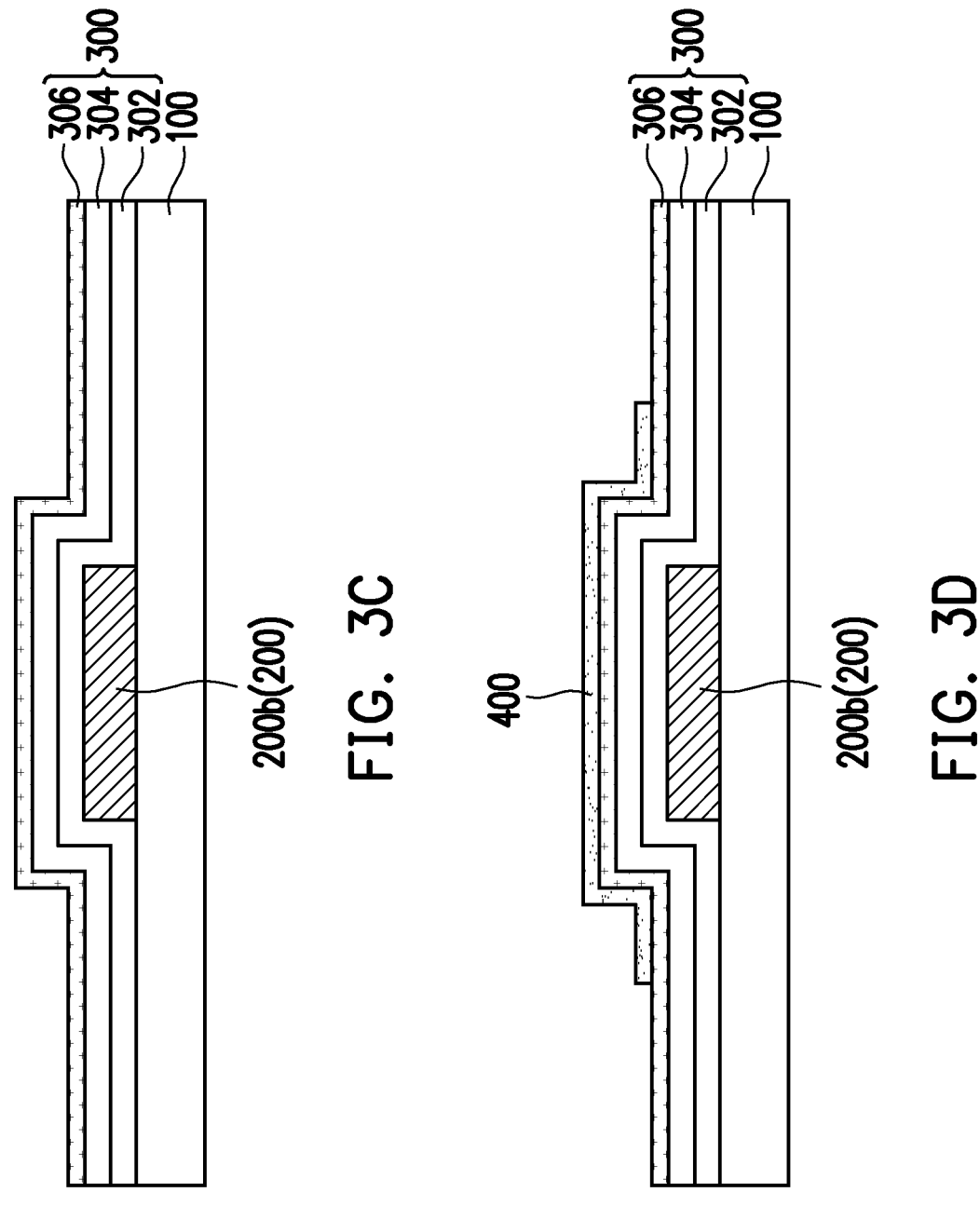

Referring to FIG. 2C and FIG. 3C, a memory cell 300 is conformally formed over the dielectric layer 100 and the first gate electrode 200. For example, the memory cell 300 is formed to be in physical contact with the dielectric layer 100 and the first gate electrode 200. In some embodiments, the memory cell 300 is a multi-layered structure. For example, the memory cell 300 includes a barrier layer 302, a trapping layer 304, and a tunneling layer 306 stacked in sequential order over the dielectric layer 100 and the first gate electrode 200.

In some embodiments, the barrier layer 302 is conformally formed on the dielectric layer 100 and the first gate electrode 200. For example, the barrier layer 302 is in physical contact with the dielectric layer 100 and the first gate electrode 200. In some embodiments, the barrier layer 302 is formed by a suitable deposition process, such as CVD, PECVD, flowable chemical vapor deposition (FCVD), high-density-plasma chemical vapor deposition (HDP-CVD), sub-atmospheric chemical vapor deposition (SACVD), PVD, or ALD. In some embodiments, the barrier layer 302 is formed to have a thickness ranging from about 10 Å to about 60 Å. In some embodiments, a material of the barrier layer 302 includes aluminum oxide ($AlO_x$), silicon oxide ($SiO_x$), or the like.

As illustrated in FIG. 2C and FIG. 3C, the trapping layer 304 is conformally formed on the barrier layer 302. For example, the trapping layer 304 is in physical contact with the barrier layer 302. In some embodiments, the trapping layer 304 is formed by a suitable deposition process, such as CVD, PECVD, FCVD, HDP-CVD, SACVD, PVD, or ALD. In some embodiments, the trapping layer 304 is formed to have a thickness ranging from about 10 Å to about 60 Å. In some embodiments, a material of the trapping layer 304 is different from the material of the barrier layer 302. For example, the material of the trapping layer 304 includes hafnium oxide ($HfO_x$), silicon nitride ($SiN_x$), or the like. In some embodiments, the trapping layer 304 is utilized to trap electrons. For example, the trapping layer 304 may be utilized to store data. As such, in some embodiments, the trapping layer 304 is referred to as a "storage layer."

In some embodiments, the tunneling layer 306 is conformally formed on the trapping layer 304. For example, the tunneling layer 306 is in physical contact with the trapping layer 304 such that the trapping layer 304 is sandwiched between the barrier layer 302 and the tunneling layer 306. In some embodiments, the tunneling layer 306 is formed by a suitable deposition process, such as CVD, PECVD, FCVD, HDP-CVD, SACVD, PVD, or ALD. In some embodiments, the tunneling layer 306 is formed to have a thickness smaller than both of the thickness of the barrier layer 302 and the thickness of the trapping layer 304. For example, the thickness of the tunneling layer 306 ranges from about 10 Å to about 30 Å. In some embodiments, a material of the tunneling layer 306 includes aluminum oxide ($AlO_x$), silicon oxide ($SiO_x$), or the like. That is, the material of the tunneling layer 306 is the same as the material of the barrier layer 302 while being different from the material of the trapping layer 304. However, the disclosure is not limited thereto. In some alternative embodiments, the material of the tunneling layer 306 may be different from the material of the barrier layer 302. For example, the material of the barrier layer 302 may be aluminum oxide while the material of the tunneling layer 306 may be silicon oxide.

Depending on the material utilized, the memory cell 300 may be referred to as a "SONOS memory cell" in some embodiments. In some embodiments, the memory cell 300 is further referred to as a "floating gate memory cell."

Figure 2D:
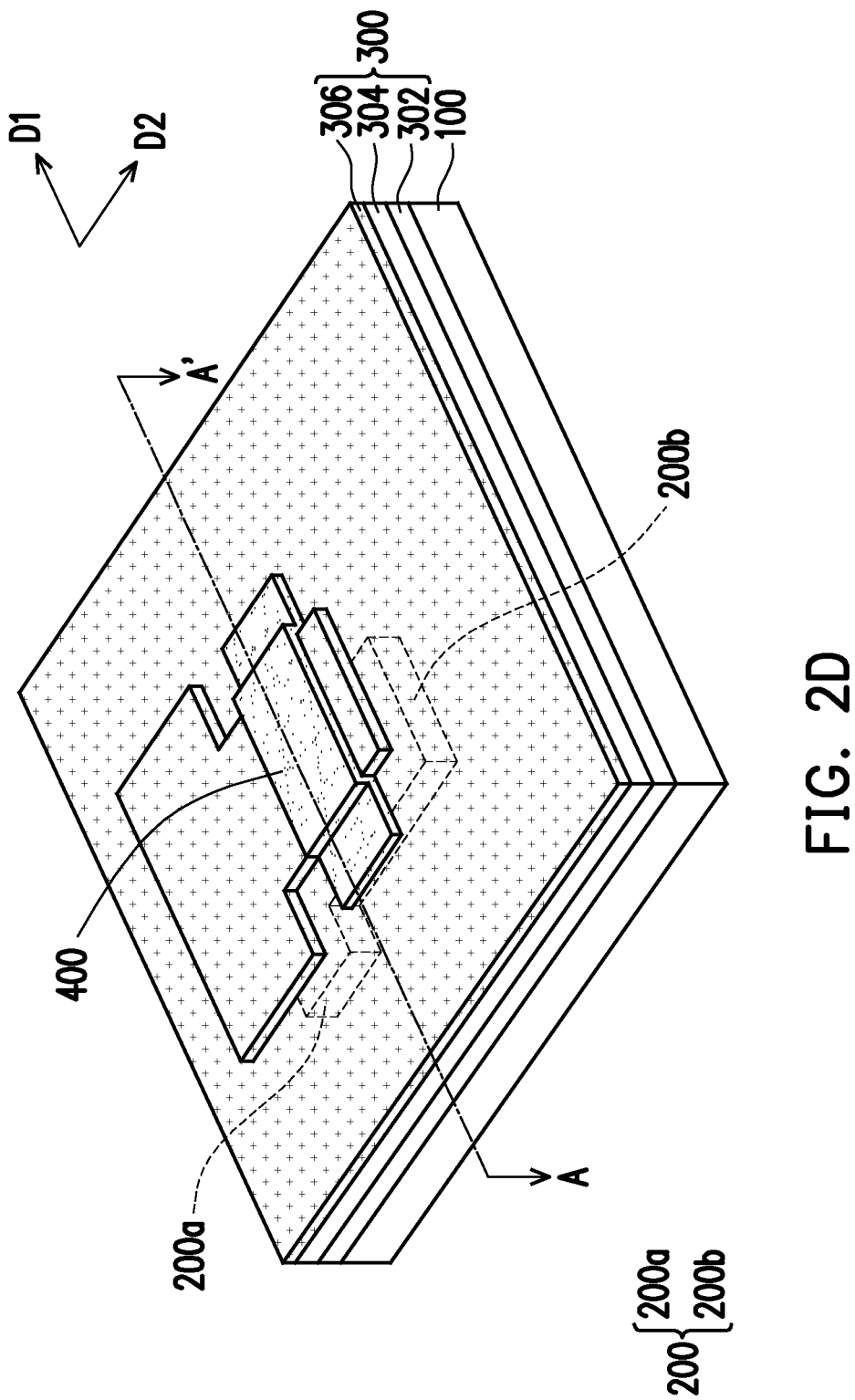

Referring to FIG. 2D and FIG. 3D, a channel layer 400 is formed over the first gate electrode 200 and the memory cell 300. For example, the channel layer 400 is disposed on the tunneling layer 306 of the memory cell 300. In some embodiments, the channel layer 400 is in physical contact with the tunneling layer 306. In some embodiments, the channel layer 400 partially covers the memory cell 300. For example, at least a portion of the tunneling layer 306 of the memory cell 300 is exposed by the channel layer 400. In some embodiments, the channel layer 400 partially overlaps with the first gate electrode 200 underneath the memory cell 300. For example, as illustrated in FIG. 2D, the channel layer 400 overlaps with a portion of the second portion 200b of the first gate electrode 200 from the top view. In some embodiments, at least a portion of the memory cell 300 is sandwiched between the first gate electrode 200 and the channel layer 400.

In some embodiments, the channel layer 400 includes oxide semiconductor materials, 2D materials, or a combination thereof. Examples of the oxide semiconductor material include ZnO, IGZO, the like, or a combination thereof. On the other hand, examples of the 2D materials include $MoS_2$, $WS_2$, $WSe_2$, InSe, the like, or a combination thereof. In some embodiments, the channel layer 400 is made of a single layer having one of the foregoing materials. However, the disclosure is not limited thereto. In some alternative embodiments, the channel layer 400 may be made of a laminate structure of at least two of the foregoing materials. In some embodiments, the channel layer 400 is doped with a dopant to achieve extra stability. For example, the channel layer 400 may be doped with silicon dopant or the like. In some embodiments, the channel layer 400 is deposited by suitable techniques, such as CVD, ALD, PVD, PECVD, epitaxial growth, or the like.

In some embodiments, the channel layer 400 has a thickness ranging from about 7 Å to about 10 Å. As illustrated in FIG. 2D, the channel layer 400 extends along the first direction D1. In other words, the channel layer 400 is parallel to the first portion 200a of the first gate electrode 200. Meanwhile, the channel layer 400 is perpendicular to the second portion 200b of the first gate electrode 200.

Figure 2E:
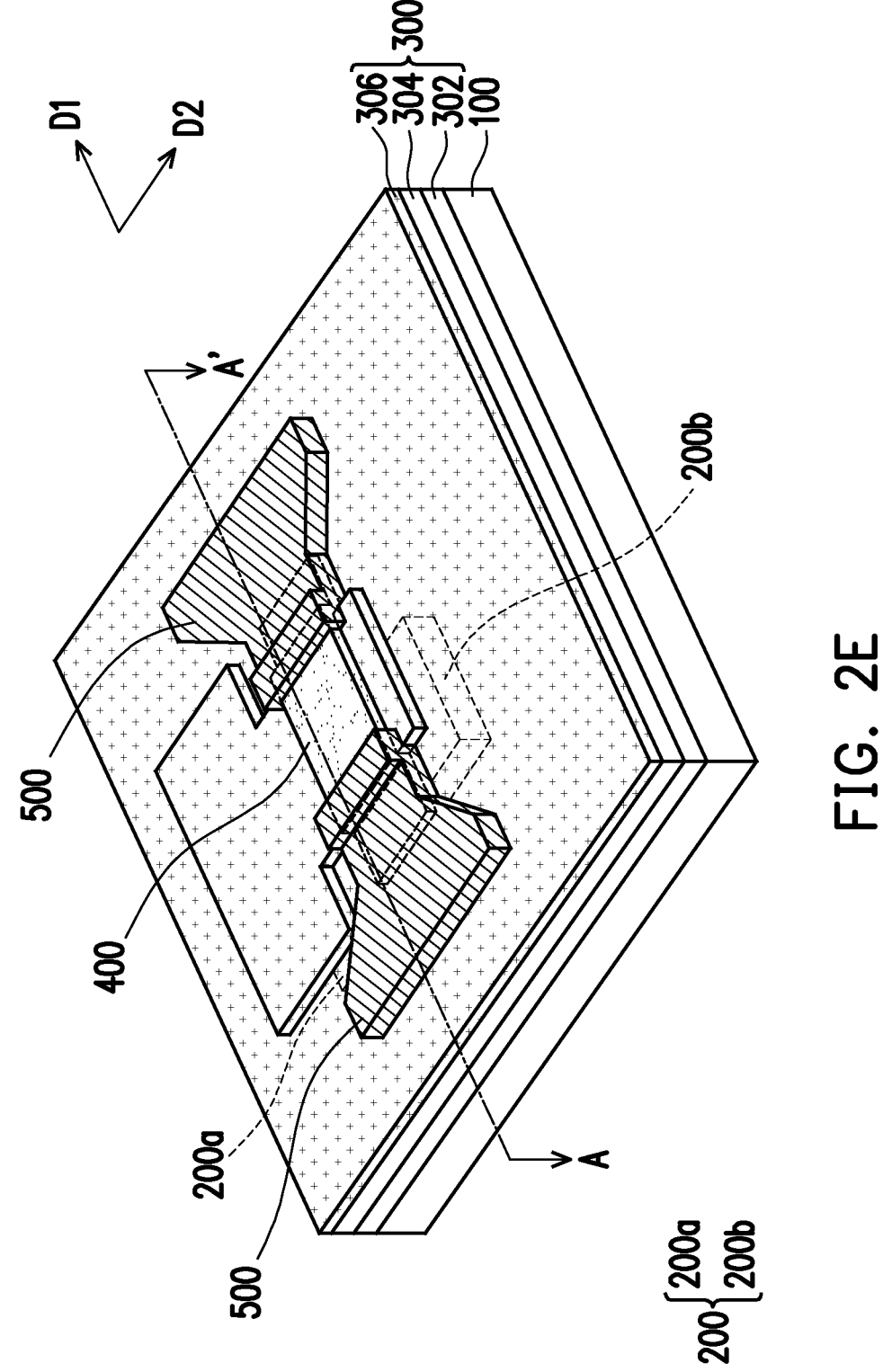
Figures 3E, 3F:
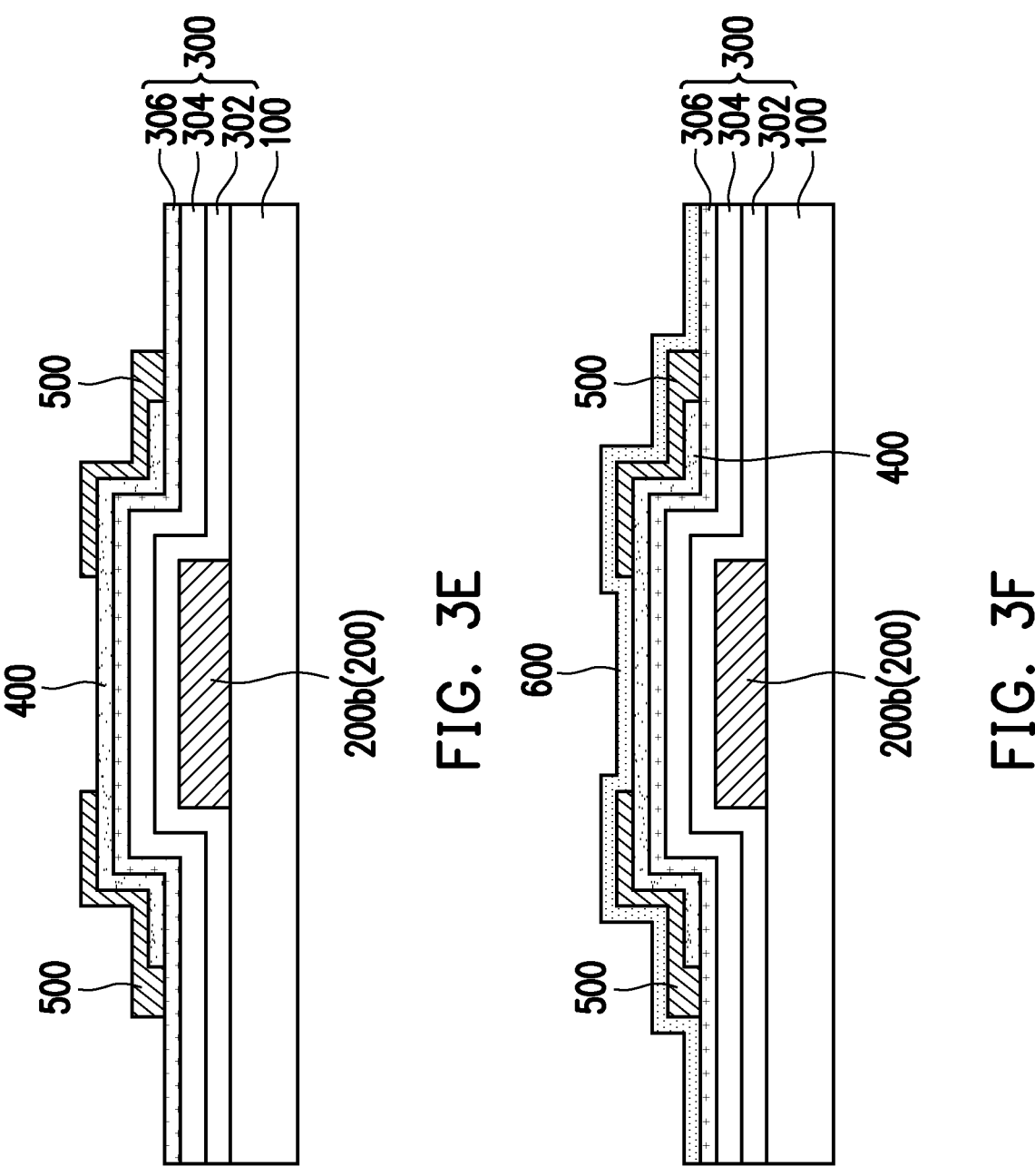

Referring to FIG. 2E and FIG. 3E, source/drain regions 500 are formed on the channel layer 400 and the memory cell 300. For example, the source/drain regions 500 are formed near two ends of the channel layer 400 and extends from the channel layer 400 to the memory cell 300. That is, the source/drain regions 500 cover the two tails of the channel layer 400 to be in physical contact with the channel layer 400 and the memory cell 300. For example, the source/drain regions 500 extends from the two tails of the channel layer 400 to the tunneling layer 306 of the memory cell 300. In some embodiments, a material of the source/drain regions 500 includes cobalt, tungsten, copper, titanium, tantalum, aluminum, zirconium, hafnium, a combination thereof, or other suitable metallic materials. In some embodiments, the source/drain regions 500 are formed through CVD, ALD, plating, or other suitable deposition techniques.

In some embodiments, the source/drain regions 500 are formed to have a thickness ranging from about 10 Å to about 100 Å. As illustrated in FIG. 2E, the source/drain regions 500 respectively exhibits a funnel shape from the top view. Moreover, the source/drain regions 500 respectively extend along the first direction D1. In some embodiments, the source/drain regions 500 partially overlap with the first gate electrode 200 underneath the memory cell 300 and the channel layer 400. For example, as illustrated in FIG. 2E, the source/drain regions 500 overlap with a portion of the second portion 200b of the first gate electrode 200 from the top view.

Figure 2F:
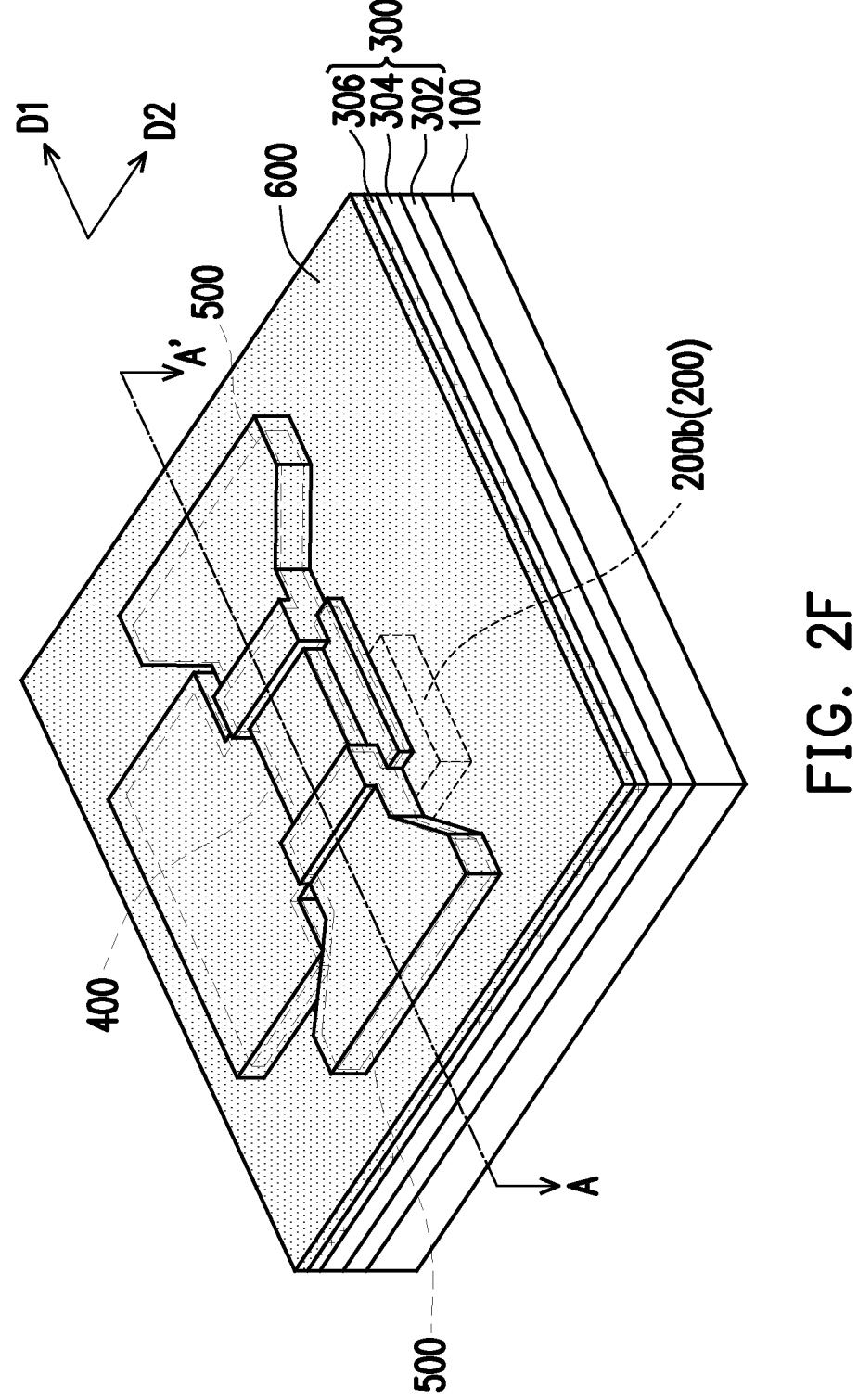

Referring to FIG. 2F and FIG. 3F, a gate dielectric layer 600 is conformally formed on the memory cell 300, the channel layer 400, and the source/drain regions 500. In some embodiments, the gate dielectric layer 600 is in physical contact with the channel layer 400, the source/drain regions 500, and the tunneling layer 306 of the memory cell 300. As illustrated in FIG. 2F and FIG. 3F, a portion of the source/drain regions 500 is located between the channel layer 400 and the gate dielectric layer 600, and another portion of the source/drain regions 500 is located between the tunneling layer 306 of the memory cell 300 and the gate dielectric layer 600. In some embodiments, the gate dielectric layer 600 has a thickness ranging from about 10 Å to about 100 Å.

In some embodiments, the gate dielectric layer 600 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layer 600 includes metal oxides, metal nitrides, metal silicates, transition metal-oxides, transition metal-nitrides, transition metal-silicates, oxynitrides of metals, metal aluminates, or combinations thereof. For example, the gate dielectric layer 600 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The foregoing materials may be deposited by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. However, the disclosure is not limited thereto. In some alternative embodiments, a material of the gate dielectric layer 600 includes hexagonal boron nitride (hBN). When the gate dielectric layer 600 includes hBN, the gate dielectric layer 600 is formed by the following steps. First, a copper film (not shown) is provided. Thereafter, an hBN film is formed on the copper film. In some embodiments, the hBN film is deposited through CVD, low-pressure chemical vapor deposition (LPCVD), or other suitable deposition methods. In some embodiments, the precursors (for example, the process gases) for forming the hBN film include ammonia borane ($H_3NBH_3$), borazine ($B_3H_6N_3$), a combination thereof, and/or the like. In some embodiments, the temperature of the precursors is in the range from about 60° C. to about 130° C. In some embodiments, during the deposition of the hBN film, the exposed copper atoms of the copper film act as a catalyst to activate the precursor molecules (i.e. boron and nitride), so the boron nitride monolayer to be grown on the copper film. After the formation of the hBN film, the hBN film may be peeled off from the copper film and transferred onto the memory cell 300, the channel layer 400, and the source/drain regions 500 to serve as the gate dielectric layer 600.

Figure 2G:
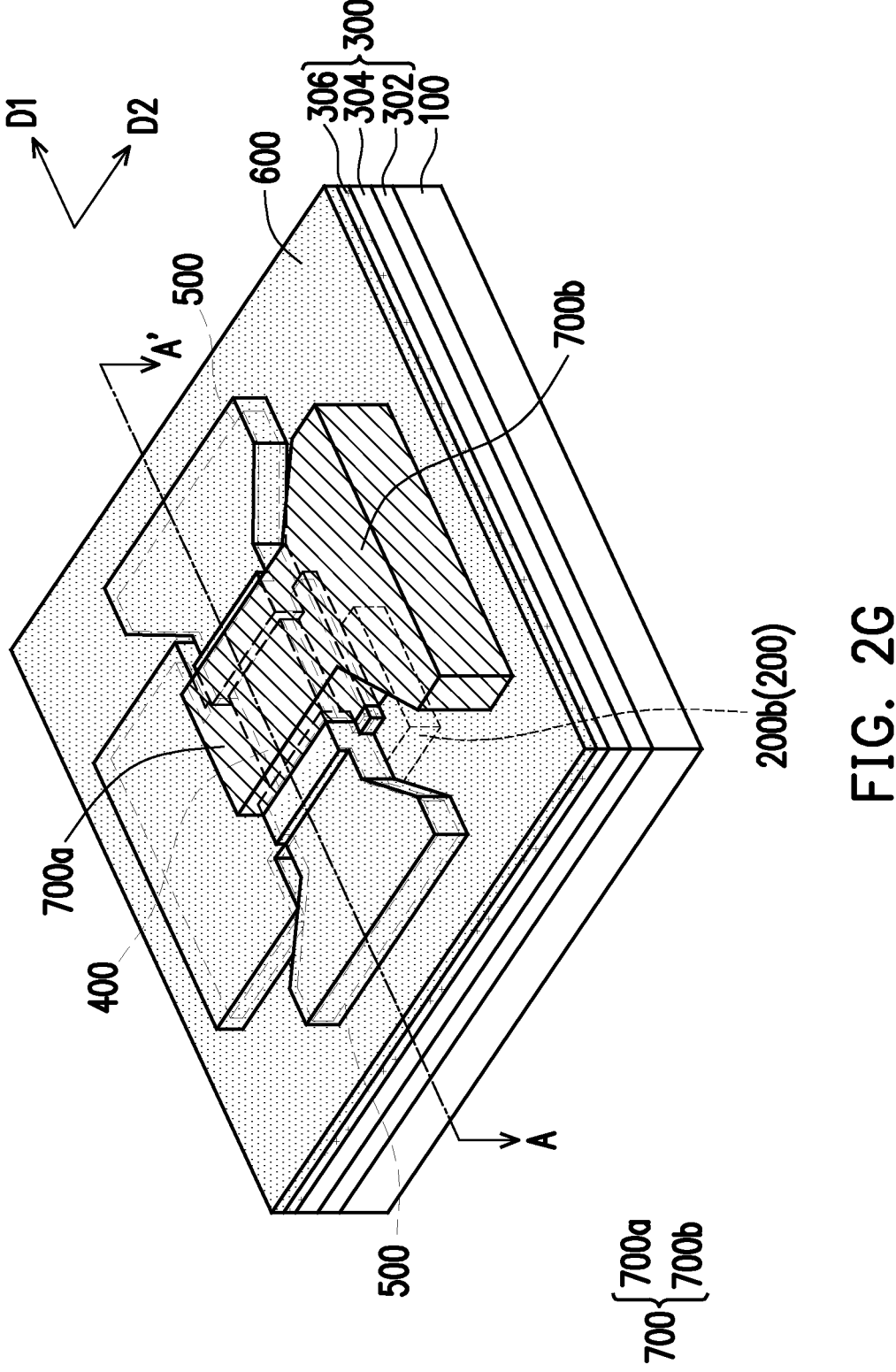
Figure 3G:
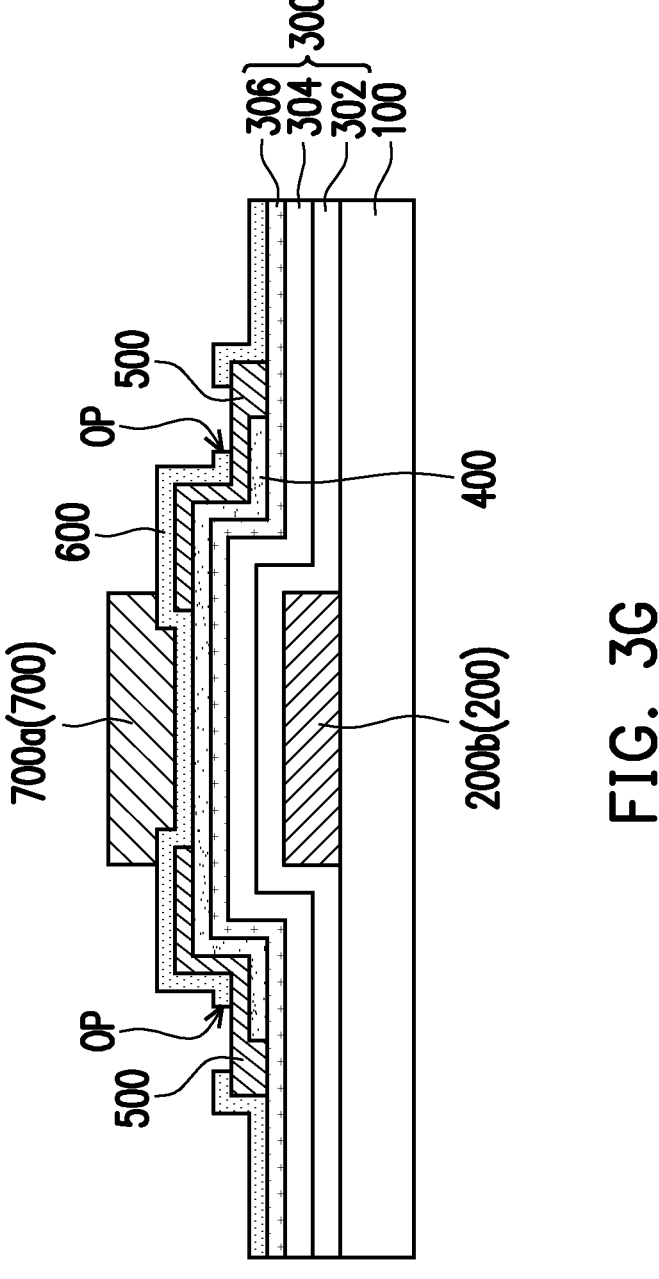

Referring to FIG. 2G and FIG. 3G, a second gate electrode 700 is formed on the gate dielectric layer 600. For example, the second gate electrode 700 is formed such that the gate dielectric layer 600 is sandwiched between the channel layer 400 and the second gate electrode 700. In some embodiments, the formation method of the second gate electrode 700 is similar to that of the first gate electrode 200, so the detailed description thereof is omitted herein. In some embodiments, a material of the second gate electrode 700 is the same as the material of the first gate electrode 200. However, the disclosure is not limited thereto. In some alternative embodiments, the material of the second gate electrode 700 is different from the material of the first gate electrode 200. In some embodiments, the material of the second gate electrode 700 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the second gate electrode 700 also includes materials to fine-tune the corresponding work function. For example, the material of the second gate electrode 700 may include p-type work function materials such as Ru, Mo, WN, ZrSi$_2$, MoSi$_2$, TaSi$_2$, NiSi$_2$, or combinations thereof, or n-type work function materials such as Ag, TaCN, Mn, or combinations thereof.

In some embodiments, a thickness of the second gate electrode 700 ranges from about 10 Å to about 1000 Å. In some embodiments, the second gate electrode 700 has a first portion 700*a* and a second portion 700*b* connected to the first portion 700*a*. As illustrated in FIG. 2G, the first portion 700*a* of the second gate electrode 700 extends along the second direction D2. Meanwhile, the second portion 700*b* of the second gate electrode 700 extends along the first direction D1. In other words, the first portion 700*a* of the second gate electrode 700 is perpendicular to the second portion 700*b* of the second gate electrode 700. For example, as illustrated in FIG. 2G, the second gate electrode 700 exhibits a funnel shape or a T shape from the top view. In some embodiments, the second gate electrode 700 is partially overlapped with the source/drain regions 500, the channel layer 400, the memory cell 300, and the first gate electrode 200, as shown in FIG. 2G and FIG. 3G. That is, a portion of the memory cell 300, a portion of the channel layer 400, a portion of the source/drain regions 500, and a portion of the gate dielectric layer 600 are located between the first gate electrode 200 and the second gate electrode 700.

Figure 2H:
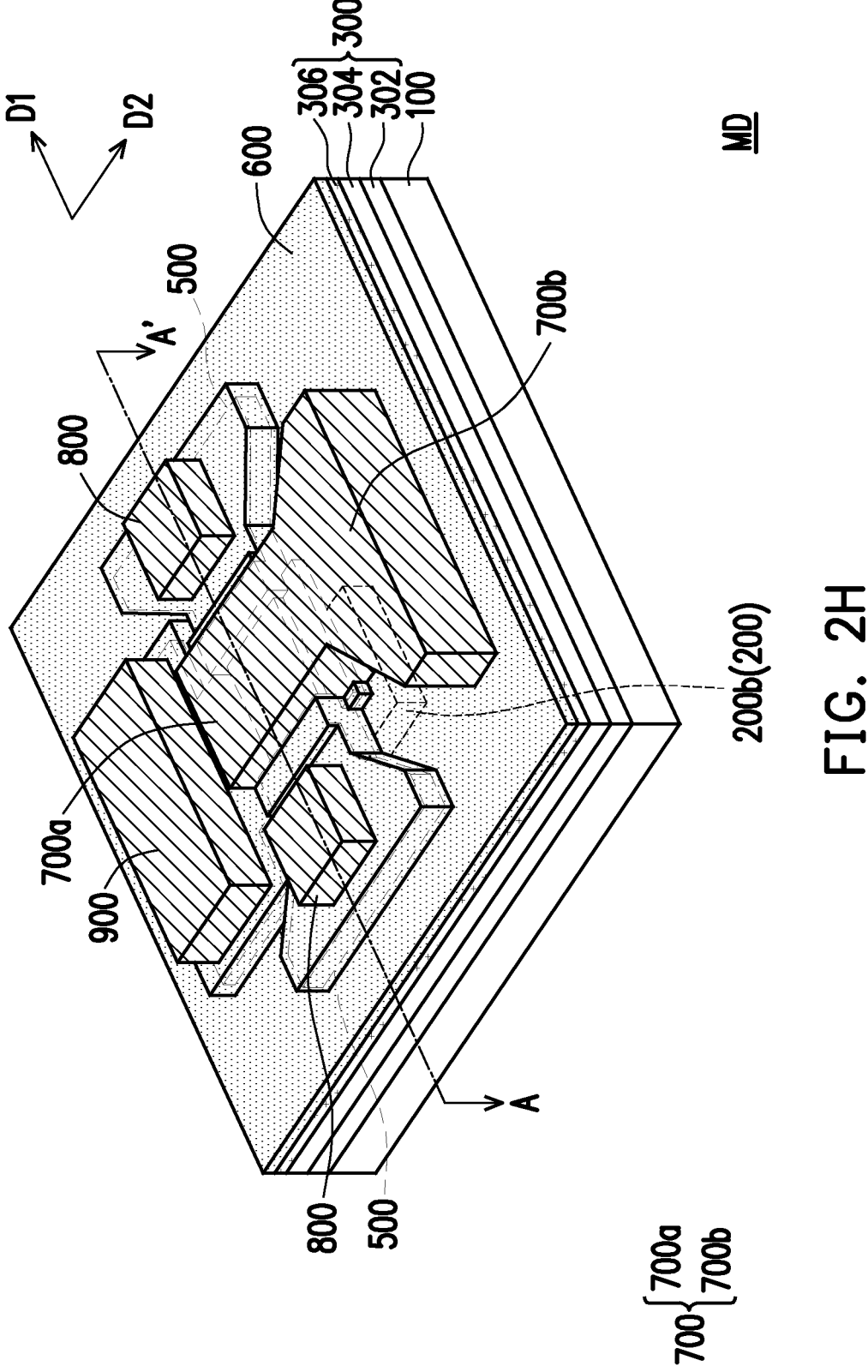
Figure 3H:
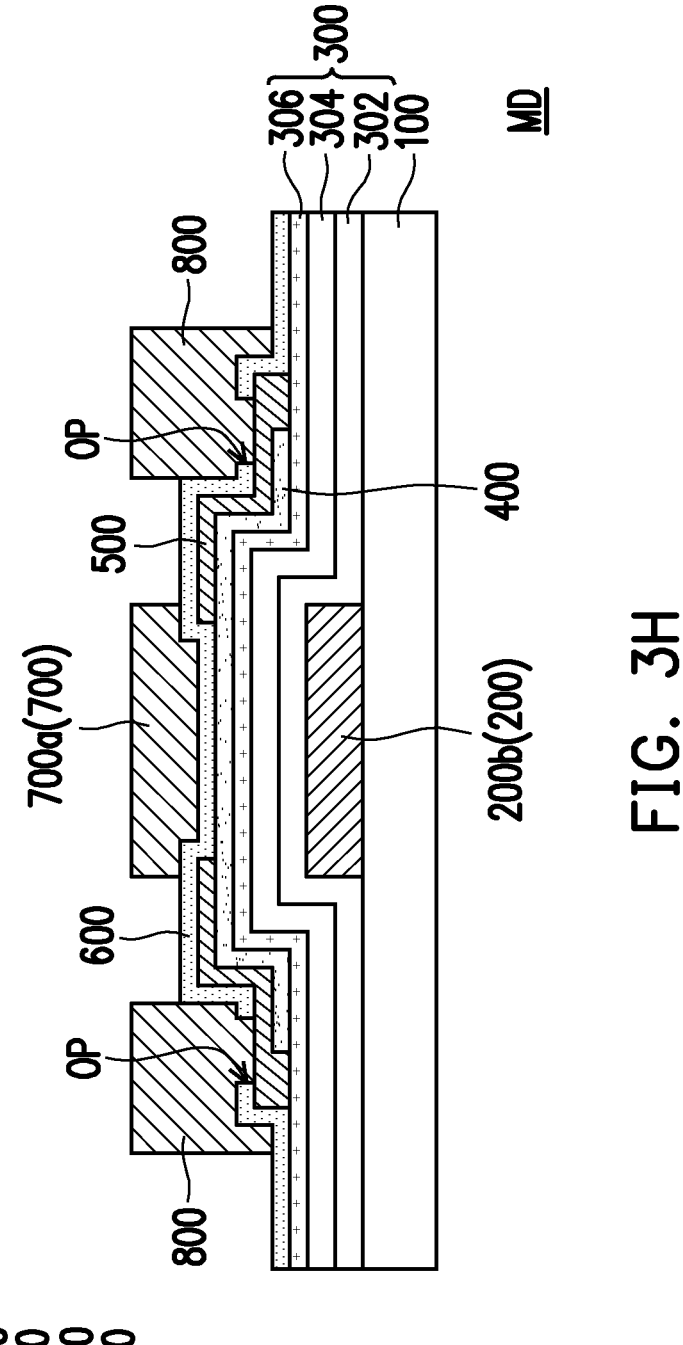

Referring to FIG. 2H and FIG. 3H, source/drain contacts 800 and a gate contact 900 are formed on the gate dielectric layer 600 to obtain a memory device MD. In some embodiments, the source/drain contacts 800 are formed by the following steps. First, openings OP are formed in the gate dielectric layer 600 to expose at least a portion of the source/drain regions 500. For example, the openings OP of the gate dielectric layer 600 expose two ends of the source/drain regions 500. After the openings OP are formed, a metallic material is filled into the openings OP, so as to form the source/drain contacts 800. In some embodiments, a material of the source/drain contacts 800 is the same as the material of the source/drain regions 500. However, the disclosure is not limited thereto. In some alternative embodiments, the material of the source/drain contacts 800 may be different from the material of the source/drain regions 500. In some embodiments, the material of the source/drain contacts 800 includes cobalt, tungsten, copper, titanium, tantalum, aluminum, zirconium, hafnium, a combination thereof, or other suitable metallic materials. In some embodiments, the metallic material of the source/drain contacts 800 is formed through CVD, ALD, plating, or other suitable deposition techniques. As illustrated in FIG. 3H, the source/drain contacts 800 extend into the openings OP of the gate dielectric layer 600 to be in physical contact with the source/drain regions 500. In other words, the source/drain contacts 800 are electrically connected to the source/drain regions 500 to serve as contact plugs for transmitting signal between the source/drain regions 500 and other components.

In some embodiments, the gate contact 900 is also formed on the gate dielectric layer 600. The material and the formation method of the gate contact 900 are similar to that of the source/drain contacts 800, so the detailed descriptions thereof are omitted herein. In some embodiments, an opening (not shown) is formed to penetrate through the gate dielectric layer 600 and the memory cell 300 to partially expose the first gate electrode 200. The gate contact 900 extends into this opening to be in physical contact with the first gate electrode 200. In other words, the gate contact 900 is electrically connected to the first gate electrode 200 to serve as a contact plug for transmitting signal between the first gate electrode 200 and other components. For example, the first gate electrode 200 is connected to a ground voltage through the gate contact 900. In some embodiments, the ground voltage may be a reference voltage and remains a constant. In some embodiments, the first gate electrode 200 and the second gate electrode 700 are electrically insulated. For example, as illustrated in FIG. 2H, the second gate electrode 700 is spaced apart from the gate contact 900, so as to be electrically insulated from the gate contact 900. In some embodiments, the second gate electrode 700 is connected to a voltage different from the ground voltage in which the first gate electrode 200 is connected to. That is, different biases are applied to the first gate electrode 200 and the second gate electrode 700 during operation of the memory device MD. For example, the second gate electrode 700 may be connected to a voltage higher than the ground voltage. However, the disclosure is not limited thereto. In some alternative embodiments, the second gate electrode 700 may be connected to a voltage lower than the ground voltage.

In some embodiments, the source/drain contacts 800 and the gate contact 900 are respectively formed to have a thickness ranging from about 10 Å to about 1000 Å. In some embodiments, the source/drain contacts 800 and the gate contact 900 are simultaneously formed. That is, the source/drain contact 800 and the gate contact 900 belong to the same layer and are formed by the same process. It should be noted that although FIGS. 2G-2H and FIGS. 3G-3H illustrated that the formation of the second gate electrode 700 precedes the formation of the source/drain contacts 800 and the gate contact 900, the disclosure is not limited thereto. In some alternative embodiments, the second gate electrode 700, the source/drain contacts 800, and the gate contact 900 may be simultaneously formed through the same process. As illustrated in FIG. 3H, top surfaces of the source/drain contacts 800 and a top surface of the second gate electrode 700 are substantially levelled (i.e. located at the same level height). However, the disclosure is not limited thereto. In some alternative embodiments, the top surfaces of the source/drain contacts 800 may be located at a level height higher than or lower than that of the top surface of the second gate electrode 700.

After the formation of the source/drain contacts 800 and the gate contact 900, the process of manufacturing the memory device MD is substantially completed. In some embodiments, the first gate electrode 200, the channel layer 400, the source/drain regions 500, the gate dielectric layer 600, the second gate electrode 700, the source/drain contacts 800, and the gate contact 900 are collectively referred to as a second transistor T2. In other words, the memory device MD includes the second transistor T2 and the memory cell 300, and the memory cell 300 is embedded/integrated within the second transistor T2. In some embodiments, the first gate electrode 200 of the second transistor T2 serves as a bottom electrode of the memory cell 300 while the second gate electrode 700 of the second transistor T2 serves as a top electrode of the memory cell 300.

In some embodiments, the second transistor T2 is a thin film transistors (TFT). Since the second transistor T2 includes the first gate electrode 200 and the second gate electrode 700, the second transistor T2 may be referred to as a "double gate transistor" or a "dual gate transistor" in some embodiments. Referring to FIG. 1 and FIG. 3H, the source/drain contacts 800 extend from the channel layer 400 to the conductive pads 34 of the interconnect structure 30. In other words, the second transistors T2 is electrically connected to the first transistor T1 and the conductive terminals 80 through the conductive vias 32 and the conductive patterns 34 of the interconnect structure 30. In some embodiments, the second transistors T2 is a selector for the memory device MD.

Furthermore, as mentioned above, the memory device MD is embedded in the interconnect structure 30, which is being considered as formed during back-end-of-line (BEOL) process. That is, the second transistor T2 and the memory cell 300 are both being considered as formed during BEOL process. However, the disclosure is not limited thereto. In some alternative embodiments, the memory device MD may be formed in the front-end-of-line (FEOL) process. When the memory device MD is formed in the front-end-of-line (FEOL) process, the substrate 20 in FIG. 1 may be a SOI substrate and the dielectric layer 100 in FIG. 2A and FIG. 3A may be the dielectric of the SOI substrate.

As illustrated in FIG. 3H, the channel layer 400 and the source/drain regions 500 are located between the memory cell 300 and the second gate electrode 700. That is, the second gate electrode 700 and the memory cell 300 are located on opposite sides of the channel layer 400. As such, when applying a bias to the second gate electrode 700 to turn on the second transistor T2 (i.e. driving the electrons to pass through the channel layer 400), the electric field generated would be far away from the storage layer (i.e. the trapping layer 304) of the memory cell 300. As such, the charges stored in the storage layer would not be affected by the electric field generated from applying the bias, thereby enhancing the read disturbance immunity. In other words, the stability of the storage capability of the memory cell 300 may be enhanced, and the cycle time of the memory device MD may be extended. Moreover, as illustrated in FIG. 3H, the channel layer 400 is located between the source/drain regions 500 and the memory cell 300, and the source/drain regions 500 are overlapped with the first gate electrode 200. As such, the charges stored in the trapping layer 304 of the memory cell 300 can interact/affect the electrons/charges in the channel layer 400, thereby allowing the on-resistance ($R_{ON}$) of the second transistor T2 to be tunable based on the charges stored in the trapping layer 304 and the pulse given to the first gate electrode 200. Since the conductance of the memory device MD is inversely proportional to $R_{ON}$, by modulating $R_{ON}$ of the second transistor T2, the conductance of the memory device MD may be adjusted, thereby achieving higher flexibility in the memory device MD.

Figure 4:
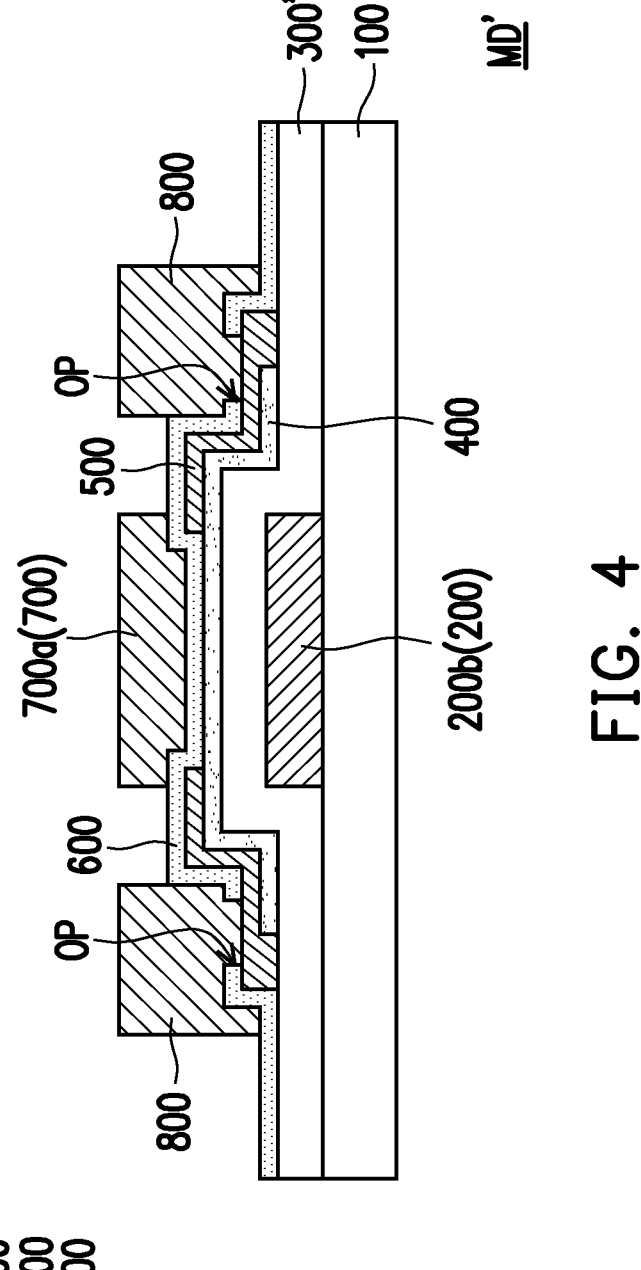
FIG. 4 is a cross-sectional view of a memory device in accordance with some alternative embodiments of the disclosure.

FIG. 4 is a cross-sectional view of a memory device MD' in accordance with some alternative embodiments of the disclosure. Referring to FIG. 4, the memory device MD' in FIG. 4 is similar to the memory device MD in FIG. 3H, so similar elements are denoted by the same reference numeral and the detailed description thereof is omitted herein. However, in the memory device MD' of FIG. 4, the memory cell 300' is a single-layered structure. For example, the memory cell 300' is formed by a single ferroelectric layer. In some embodiments, the ferroelectric layer includes $Pb_3Ge_3O_{11}$ (PGO), lead zirconate titanate (PZT), $SrBi_2Ta_2O_9$ (SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, $ZrAlSiO$, $HfO_2$, hafnium silicate, $HfAlO$, $LaAlO$, lanthanum oxide, $HfO_2$ doped with Si, $a_2O_5$, $HfZrO_x$, or a combination thereof. In some embodiments, the ferroelectric layer is referred to as a "storage layer."

As illustrated in FIG. 4, the channel layer 400 and the source/drain regions 500 are located between the memory cell 300' and the second gate electrode 700. That is, the second gate electrode 700 and the memory cell 300' are located on opposite sides of the channel layer 400. As such, when applying a bias to the second gate electrode 700 to turn on the second transistor T2 (i.e. driving the electrons to pass through the channel layer 400), the electric field generated would be far away from the memory cell 300'. As such, the charges stored in the memory cell 300' would not be affected by the electric field generated from applying the bias, thereby enhancing the read disturbance immunity. In other words, the stability of the storage capability of the memory cell 300' may be enhanced, and the cycle time of the memory device MD' may be extended. Moreover, as illustrated in FIG. 4, the channel layer 400 is located between the source/drain regions 500 and the memory cell 300', and the source/drain regions 500 are overlapped with the first gate electrode 200. As such, the charges stored in the memory cell 300' can interact/affect the electrons/charges in the channel layer 400, thereby allowing the $R_{ON}$ of the second transistor T2 to be tunable based on the charges stored in the memory cell 300' and the pulse given to the first gate electrode 200. Since the conductance of the memory device MD' is inversely proportional to $R_{ON}$, by modulating $R_{ON}$ of the second transistor T2, the conductance of the memory device MD' may be adjusted, thereby achieving higher flexibility in the memory device MD'.

In accordance with some embodiments of the disclosure, a memory device includes a transistor and a memory cell. The transistor includes a first gate electrode, a second gate electrode, a channel layer, and a gate dielectric layer. The second gate electrode is over the first gate electrode. The channel layer is located between the first gate electrode and the second gate electrode. The gate dielectric layer is located between the channel layer and the second gate electrode. The memory cell is sandwiched between the first gate electrode and the channel layer.

In accordance with some embodiments of the disclosure, an integrated circuit includes a substrate, a first transistor, and an interconnect structure. The first transistor is over the substrate. The interconnect structure is disposed on the substrate. The interconnect structure includes dielectric layers and a memory device embedded in one of the dielectric layers. The memory device includes a second transistor and a memory cell. The second transistor includes a first gate electrode, a channel layer, a second gate electrode, a gate dielectric layer, and source/drain regions. The channel layer is over the first gate electrode. The second gate electrode is over the channel layer. The gate dielectric layer is located between the channel layer and the second gate electrode. The source/drain regions are located between the channel layer and the gate dielectric layer. The memory cell is sandwiched between the first gate electrode and the channel layer.

In accordance with some embodiments of the disclosure, a manufacturing method of a memory device includes at least the following steps. A dielectric layer is provided. A first gate electrode is formed on the dielectric layer. A memory cell is conformally formed on the dielectric layer and the first gate electrode. A channel layer is deposited on the memory cell. Source/drain regions are formed on the channel layer and the memory cell. A gate dielectric layer is deposited on the source/drain regions and the memory cell. A second gate electrode is formed on the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a transistor, comprising:

a first gate electrode, wherein the first gate electrode exhibits a T shape from a top view;

a second gate electrode over the first gate electrode;

a channel layer located between the first gate electrode and the second gate electrode, wherein the channel layer is a single-layered structure and comprises InSe;

a gate dielectric layer located between the channel layer and the second gate electrode, wherein the gate dielectric layer is in physical contact with the channel layer, and the gate dielectric layer has an opening;

a source region and a drain region located between the channel layer and the gate dielectric layer; and a source contact and a drain contact over the gate dielectric layer, wherein bottom surfaces of the source contact and the drain contact are in physical contact with a top surface of the gate dielectric layer, the source contact has a portion located in the opening and being laterally surrounded by the gate dielectric layer, the portion of the source contact is in physical contact with the source region, and a vertical projection of the portion of the source contact is overlapped with a sidewall of the channel layer; and a memory cell sandwiched between the first gate electrode and the channel layer, wherein the memory cell is in physical contact with the channel layer and sidewalls of the first gate electrode, the source region has a first portion and a second portion, the drain region has a third portion and a fourth portion, the first portion is closer to the drain region than the second portion is, the third portion is closer to the source region than the fourth portion is, a width of the second portion is gradually increasing away from the first portion, the width of the second portion is greater than a width of the first portion, a width of the fourth portion is gradually increasing away from the third portion, the width of the fourth portion is greater than a width of the third portion, and the width of the first portion and the width of the third portion are constant.

2. The memory device of claim 1, wherein the first gate electrode is connected to a ground voltage.

3. The memory device of claim 2, wherein the second gate electrode is connected to a voltage higher than the ground voltage.

4. The memory device of claim 1, wherein the source contact and the drain contact are electrically and respectively connected to the source region and the drain region, and the source region and the drain region are disposed in a mirror-symmetrical configuration with respect to each other.

5. The memory device of claim 1, wherein the gate dielectric layer comprises hexagonal boron nitride (hBN).

6. The memory device of claim 1, wherein the memory cell comprises:

a barrier layer disposed on the first gate electrode;

a tunneling layer disposed over the barrier layer; and a trapping layer sandwiched between the barrier layer and the tunneling layer.

7. The memory device of claim 1, wherein the barrier layer and the tunneling layer comprise aluminum oxide ($AlO_x$) or silicon oxide ($SiO_x$), and the trapping layer comprises hafnium oxide ($HfO_x$) or silicon nitride ($SiN_x$).

8. The memory device of claim 1, wherein the memory cell comprises a ferroelectric layer, and the ferroelectric layer comprises $Pb_3Ge_5O_{11}$ (PGO), lead zirconate titanate (PZT), $SrBi_2Ta_2O_9$ (SBTO), $SrB_4O_7$ (SBO), $Sr_aBi_bTa_cN-b_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, $a_2O_5$, $HfZrO_x$, or a combination thereof.

9. The memory device of claim 1, wherein the memory cell is a single-layered structure.

10. An integrated circuit, comprising:

a substrate;

a first transistor over the substrate; and an interconnect structure disposed on the substrate, comprising:

dielectric layers; and a memory device embedded in one of the dielectric layers, comprising:

a second transistor, comprising:

a first gate electrode;

a channel layer over the first gate electrode, wherein the channel layer is a single-layered structure and comprises InSe;

a second gate electrode over the channel layer;

a gate dielectric layer located between the channel layer and the second gate electrode, wherein the gate dielectric layer is in physical contact with the channel layer, and the gate dielectric layer has an opening;

a source region and a drain region located between the channel layer and the gate dielectric layer; and a source contact and a drain contact, wherein bottom surfaces of the source contact and the drain contact are in physical contact with a top surface of the gate dielectric layer, the source contact and the drain contact are electrically and respectively connected to the source region and the drain region, the source contact has a portion located in the opening and being laterally surrounded by the gate dielectric layer, the portion of the source contact is in physical contact with the source region, and a vertical projection of the portion of the source contact is overlapped with a sidewall of the channel layer; and a memory cell sandwiched between the first gate electrode and the channel layer, wherein the memory cell is in physical contact with the channel layer and sidewalls of the first gate electrode, wherein the source region has a first portion and a second portion, the drain region has a third portion and a fourth portion, the first portion is closer to the drain region than the second portion is, the third portion is closer to the source region than the fourth portion is, a width of the second portion is gradually increasing away from the first portion, the width of the second portion is greater than a width of the first portion, a width of the fourth portion is gradually increasing away from the third portion, the width of the fourth portion is greater than a width of the third portion, and the width of the first portion and the width of the third portion are constant.

11. The integrated circuit of claim 10, wherein the first gate electrode and the second gate electrode are electrically insulated from each other.

12. The integrated circuit of claim 10, wherein the memory cell comprises:

a barrier layer disposed on the first gate electrode;
a tunneling layer disposed over the barrier layer; and
a trapping layer sandwiched between the barrier layer and the tunneling layer.

13. The integrated circuit of claim 12, wherein a material of the barrier layer and a material of the tunneling layer are the same, and the material of the barrier layer and a material of the trapping layer are different.

14. The integrated circuit of claim 10, wherein the memory cell comprises a ferroelectric layer.

15. The integrated circuit of claim 10, wherein the source region and the drain region are in physical contact with the channel layer and the memory cell.

16. The integrated circuit of claim 10, wherein the gate dielectric layer is in physical contact with the source region, the drain region, and the memory cell.

17. The integrated circuit of claim 10, wherein the first gate electrode exhibits a T shape from a top view.

18. A manufacturing method of a memory device, comprising:

providing a dielectric layer;
forming a first gate electrode on the dielectric layer, wherein the first gate electrode exhibits a T shape from a top view;
conformally forming a memory cell on the dielectric layer and the first gate electrode such that the memory cell is in physical contact with sidewalls of the first gate electrode;
depositing a channel layer on the memory cell such that the memory cell is sandwiched between the first gate electrode and the channel layer, wherein the channel layer is a single-layered structure and comprises InSe, and the memory cell is in physical contact with the channel layer;
forming a source region and a drain region on the channel layer and the memory cell, wherein the source region has a first portion and a second portion, the drain region has a third portion and a fourth portion, the first portion is closer to the drain region than the second portion is, the third portion is closer to the source region than the fourth portion is, a width of the second portion is gradually increasing away from the first portion, the width of the second portion is greater than a width of the first portion, a width of the fourth portion is gradually increasing away from the third portion, the width of the fourth portion is greater than a width of the third portion, and the width of the first portion and the width of the third portion are constant;

depositing a gate dielectric layer on the source region, the drain region, and the memory cell, wherein the gate dielectric layer is in physical contact with the channel layer;

forming a second gate electrode on the gate dielectric layer and over the first gate electrode such that the channel layer is located between the first gate electrode and the second gate electrode and the gate dielectric layer is located between the channel layer and the second gate electrode, so as to form a transistor;

forming openings in the gate dielectric layer to expose at least a portion of the source region and at least a portion of the drain region; and forming a source contact and a drain contact over the gate dielectric layer, wherein bottom surfaces of the source contact and the drain contact are in physical contact with a top surface of the gate dielectric layer, the source contact has a portion located in the corresponding opening of the openings and being laterally surrounded by the gate dielectric layer, the portion of the source contact is in physical contact with the exposed portion of the source region, and a vertical projection of the portion of the source contact is overlapped with a sidewall of the channel layer.

19. The method of claim 18, wherein forming the memory cell comprises:

depositing a barrier layer on the dielectric layer and the first gate electrode;

depositing a trapping layer on the barrier layer; and depositing a tunneling layer on the trapping layer, wherein a material of the barrier layer and a material of the tunneling layer are the same, and the material of the barrier layer and a material of the trapping layer are different.

20. The method of claim 18, wherein the drain contact extends into the corresponding opening of the openings to be in physical contact with the exposed portion of the drain region.

* * * * *